(12) United States Patent
Pickering et al.

(10) Patent No.: US 7,274,216 B2
(45) Date of Patent: Sep. 25, 2007

(54) DUTY CYCLE CONTROLLED CML-CMOS CONVERTER

(75) Inventors: Andrew Pickering, Rugby (GB); Simon Forey, Northampton (GB); Peter Hunt, Northampton (GB)

(73) Assignee: Texas Instruments Incorporated, Dallas, TX (US)

( * ) Notice: Subject to any disclaimer, the term of this patent is extended or adjusted under 35 U.S.C. 154(b) by 89 days.

(21) Appl. No.: 11/150,903

(22) Filed: Jun. 13, 2005

(65) Prior Publication Data

US 2006/0001446 A1 Jan. 5, 2006

(30) Foreign Application Priority Data

Jun. 14, 2004 (GB) .................................. 0413152.0

(51) Int. Cl.
H03K 19/0175 (2006.01)
H03K 19/094 (2006.01)
H03K 19/20 (2006.01)

(52) U.S. Cl. ............................. 326/63; 326/62; 326/68; 326/80; 326/81; 326/115; 326/121; 327/333

(58) Field of Classification Search ................. 326/62, 326/80, 81, 63
See application file for complete search history.

(56) References Cited

U.S. PATENT DOCUMENTS

| | | | | |
|---|---|---|---|---|
| 5,283,482 A | | 2/1994 | Chen | |
| 5,635,880 A | * | 6/1997 | Brown | 331/108 B |
| 5,821,799 A | * | 10/1998 | Saripella | 327/333 |
| 6,011,436 A | * | 1/2000 | Koike | 330/253 |
| 6,121,793 A | * | 9/2000 | Pickering et al. | 326/73 |
| 6,339,318 B1 | * | 1/2002 | Tanaka | 323/313 |
| 6,353,335 B1 | | 3/2002 | Trop | |
| 7,030,697 B1 | * | 4/2006 | Pribytko et al. | 330/257 |
| 7,038,538 B2 | * | 5/2006 | Tran et al. | 330/134 |
| 2005/0046495 A1 | * | 3/2005 | Li | 331/57 |
| 2006/0202721 A1 | * | 9/2006 | Partow et al. | 327/65 |

FOREIGN PATENT DOCUMENTS

WO WO94/05085 3/1994

* cited by examiner

Primary Examiner—Vibol Tan
Assistant Examiner—Dylan White
(74) Attorney, Agent, or Firm—William B Kempler; W. James Brady, III; Frederick J. Telecky, Jr.

(57) ABSTRACT

There is provided a CML to CMOS converter comprising two current sources both connected between a first power supply, having a first potential, and a driving node, first and second push-pull drive stages each having a current path connected between a second power supply, having a second potential, and the driving node, and each having a control input for one half of a CML signal and an output node. Each of the two output nodes is connected to the control node of a respective one of the current sources, each current source being connected to decrease the current it supplies to the driving node if the potential of its respective output of the converter moves towards the potential of the first power supply.

22 Claims, 3 Drawing Sheets

DUTY CYCLE CONTROLLED CML-CMOS CONVERTER

BACKGROUND OF THE INVENTION

The present invention relates to integrated circuits using CMOS voltage signal levels, and more particularly, to a duty cycle controlled CML-CMOS converter, and also to a first amplification stage therefor.

The use of CML and CMOS technologies in a single integrated circuit (IC) requires a conversion of CML differential voltage levels to CMOS compatible voltage levels. CML voltage levels represent the two values of a data bit depending on which of the two levels is more positive than the other. A typical CML circuit operates with a differential swing of two to three hundred milliVolts, but smaller and larger swings are possible. In contrast, a typical CMOS circuit operates according to a single ended voltage, with two specified voltage ranges with respect to that defining the two values of a data bit.

Conventional techniques of CML to CMOS conversion are found to be lacking for high speed applications, and due to problems arising from the statistical variation of small devices. Thus there is a need for an improved CML-CMOS converter.

SUMMARY OF THE INVENTION

The present invention provides a duty cycle controlled CML-CMOS converter comprising a first amplification stage that is self-biasing.

The converter also preferably comprises a CMOS device connected between the input amplification stage and a buffering stage.

The invention and preferred features thereof are further defined in the appended claims.

Specific embodiments of the invention will now be described, by way of example only, with reference to the accompanying drawings, in which:

DETAILED DESCRIPTION

Figure 1A:
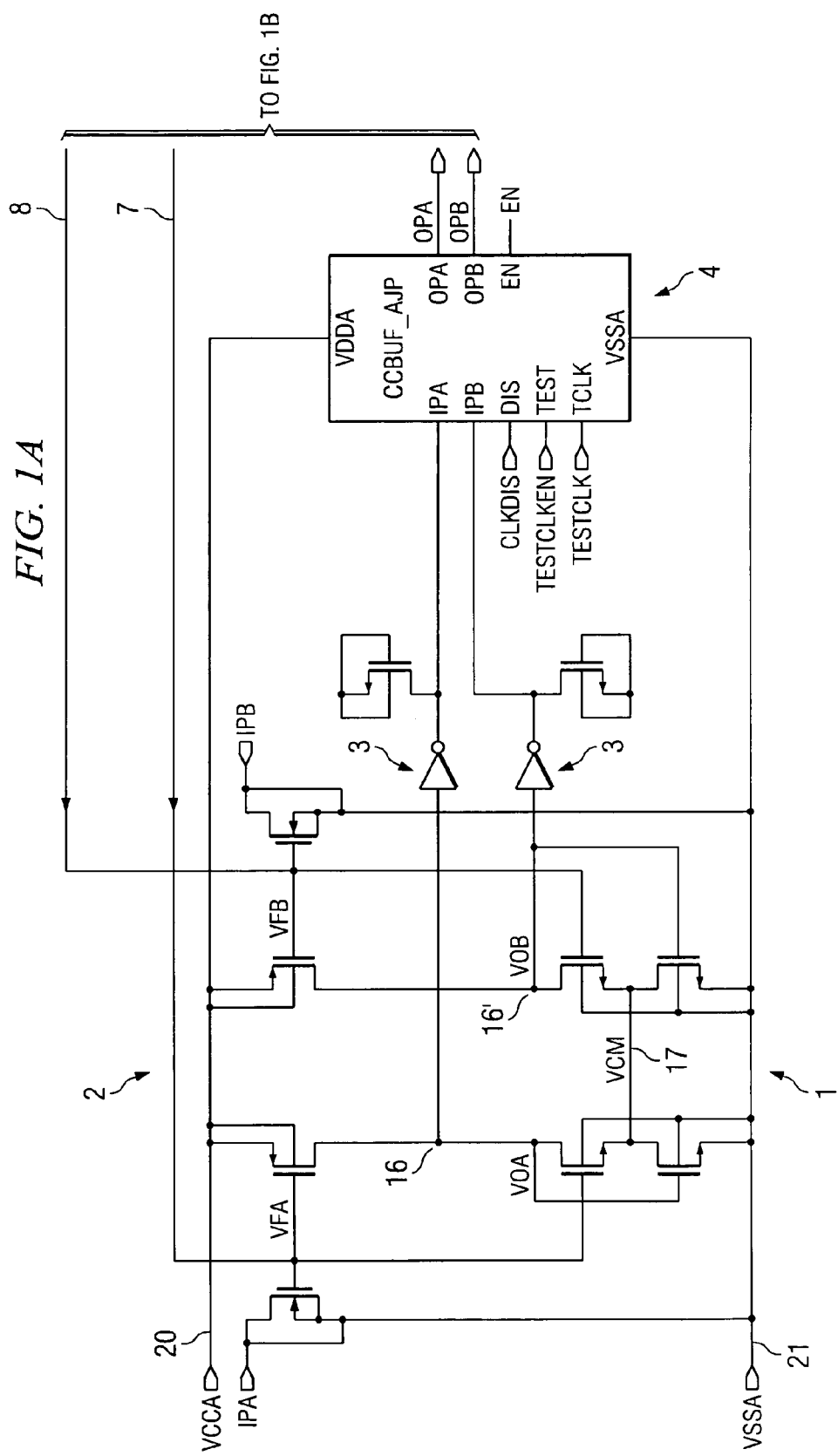
FIGS. 1A and 1B are schematic circuit diagrams of a CML-CMOS converter in accordance with an embodiment of the present invention.
Figure 1B:
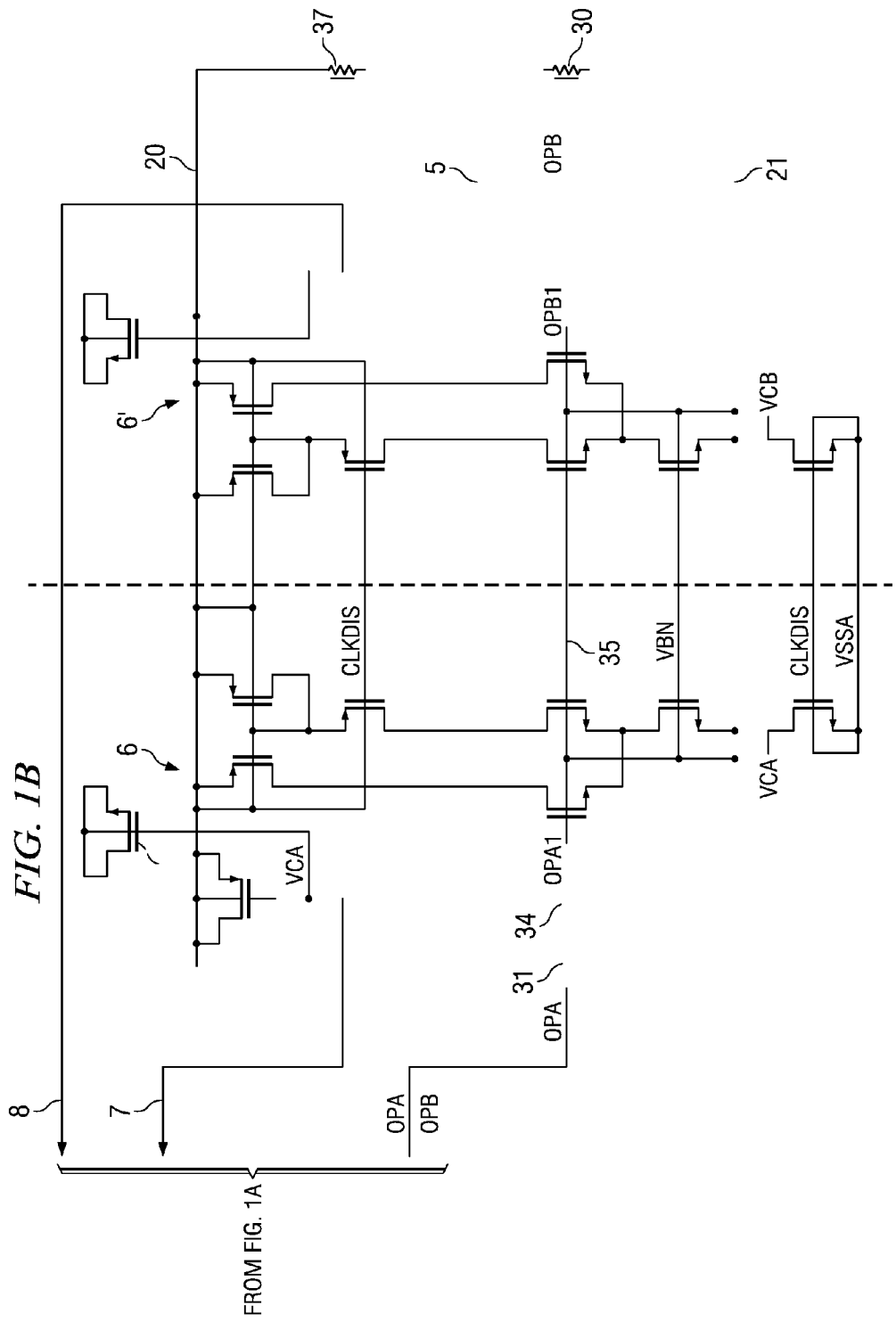

FIGS. 1A and 1B show a CML-CMOS converter 1 according to a preferred embodiment that has an input amplification stage 2, CMOS devices and buffering stage 4. The converter RO filters output clock (OPA, OPB) and compares it with half rail reference signal 5. The outputs of operational amplifiers 6, 6' (op amps) drive the input of the bias signals 7, 8. There are two op amps: one drives one side of the input amplification stage and the second op amp drives the other side of the input amplification stage.

The CMOS device 3 shown is one inverter in the path of each output from the amplification stage and provides an inversion so that the feedback of the bias is in the right sense. Whether such an inversion is required will depend on how many times the feedback circuit (here the op amps) inverts the signal. The buffering stage inverts the signal an even number of times and is therefore optional. Preferably, however, it is provided to generate a strong drive on the circuit outputs.

Figure 2:
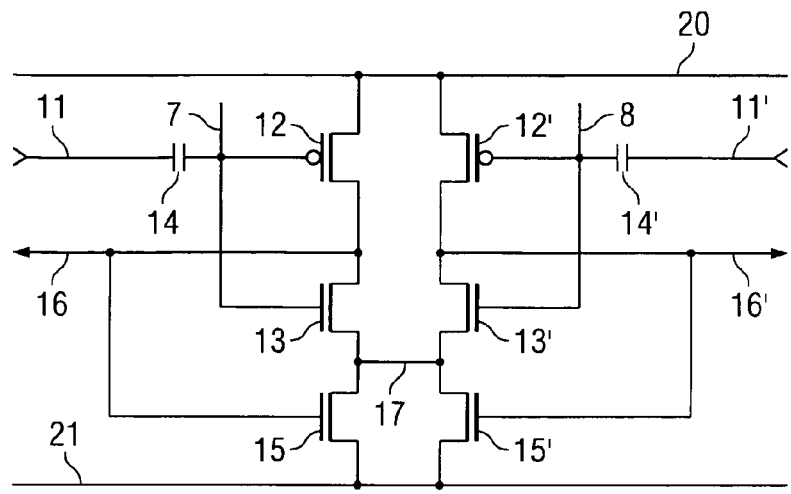
FIG. 2 is a schematic circuit diagram of the input amplification stage of a CMLCMOS converter in accordance with an embodiment of the present invention.

FIG. 2 shows an input amplification stage 2 for the CML-CMOS converter of FIG. 1. The input amplification stage is fully AC-coupled on a push-pull drive stage in order to give a higher gain. (i.e. the differential CML input signal 11, 11' is coupled to the PMOS 12, 12' and NMOS 13, 13' transistors of the push-pull drive stage via capacitors 14, 14'.) The input amplification stage comprises 6 transistors, the top 4 transistors 12, 12', 13, 13' drawing current from the bottom two biased transistors 15, 15', and is self biasing and will therefore give very fast negative feedback on any power noise. The circuit is supplied with power from a power supply 20 at one end connected to the PMOS transistors and from a power supply 21 at the other connected to the biasing transistors.

Advantages of the preferred embodiment include: good common-mode and power supply rejection, the first stage drives CMOS buffering directly, and AC-coupled with DC bias levels set by duty-cycle correction loop ensures input stage operates at optimum gain point.

The biased transistors 15 and 15' act as follows. The amplification stage acts as a differential amplifier establishing a high level on one of the outputs 16, 16' and a low level on the other 16', 16. The biased transistors provide the current driving the action of the differential amplifier at a driving node 17. As that difference on the outputs becomes established the level of one of the outputs rises turning on the respective one of the biased NMOS transistors 15, 15', whose gates are respectively connected to the outputs 16, 16', thereby providing current to drive the amplification and hastening the establishment of the high and low levels on the output. Should both outputs rise (which would be undesirable) both transistors 15, 15' are turned on drawing current from both output nodes lowering their level. Should both outputs fall (again which is undesirable) the current provided by the biased transistors falls reducing the current that they source allowing both outputs 16,16' to rise. In this way the amplification stage is self biasing.

Figure 3:
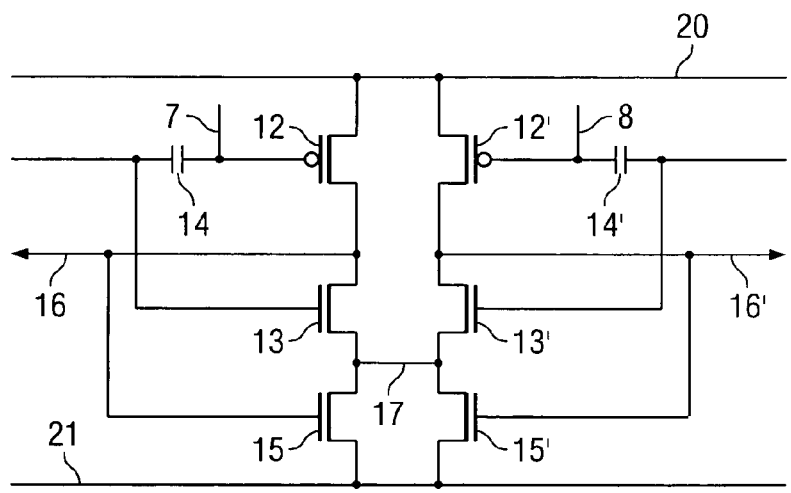
FIG. 3 is a schematic circuit diagram of the input amplification stage of a CMLCMOS converter in accordance with another embodiment of the present invention.
Figure 4:
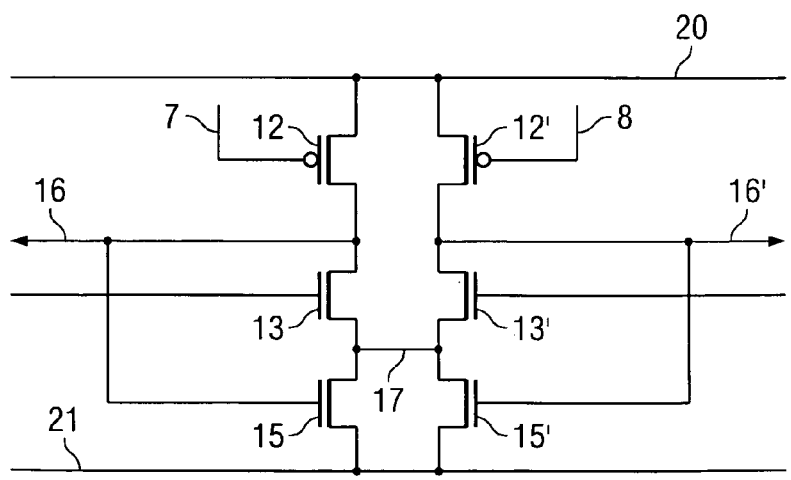
FIG. 4 is a schematic circuit diagram of the input amplification stage of a CMLCMOS converter in accordance with another embodiment of the present invention.

FIGS. 3 and 4 show different couplings of the CML circuit to the input amplification stage 2 that may be of use depending on the level of the input signal.

FIG. 3 shows an input amplification stage for the CML-CMOS converter of FIG. 1 that is ½ AC and ½ DC coupled. Here the input signal has to be sufficient to turn on the NMOS transistors.

FIG. 4 shows an input amplification stage for the CML-CMOS converter of FIG. 1 that is fully DC-coupled, and has virtually the same arrangement as that of FIG. 3 except that there are no capacitors between the top 2 transistors and the middle two transistors. The top two transistors therefore act as resistive loads. Again the input signal has to be sufficient to turn on the NMOS transistors. In theory a circuit in which the PMOS transistors 12, 12' are driven directly (with capacitive coupling) by the input signal and the NMOS transistors 13, 13' act as resistive loads is possible but is unlikely to perform well.

Returning now to FIGS. 1A and 1B, the action of the operational amplifiers is explained. The two op amps 6, 6' are independent and are separated in FIG. 1 by a dotted line.

Each op amp 6, 6' deals with the respective output 16 (or 16') of one of the push-pull stages of the amplification stage 2 and returns a bias to that same push-pull stage.

Just one of these two feedback loops will now be described, the other being the same. Following inversion by CMOS device 3 and buffering by buffering stage 4 the signal at the output 16 of one of the push pull-stages is low pass filtered by resistance 31 and a capacitance (comprising NMOS capacitance and CMOS capacitance 33) before it is applied to the inverting input 34 of the op amp 6, 6' The positive input 35 is connected to receive a bias voltage from a voltage divider comprising resistances 36 and 37. The bias voltage is preferably the voltage half way between the supply voltages 20 and 21.

The RC filter 31, 32, 33 presents the mean level of the signal received from the buffer stage 4 and therefore the level of the output 38 of the op amp 6, 6' is adjusted if the the mean level of the output of the buffer stage 4 is more or less than the level half way between the power supplies 20 and 21.

The output 38 of the op amp is low pass filtered by resistance 39 and PMOS capacitance 40 and NMOS capacitance 41 and is then applied as bias to the push-pull stage that provided the original output measured by the op amp circuit thereby closing the feedback loop. In each of the cases of the circuits of FIGS. 2, 3 and 4 the feedback signal from the op amp circuit is applied to the gate of the PMOS transistor 12 of the of the push-pull stage, (in the case of the circuit of FIG. 2 it is, of course, also applied to the gate of the NMOS transistor 13 of the push-pull stage). The effect of changing this bias is to change the mark-space ratio of the signal output by the push-pull stage, which therefore is changed if the average level of the output is different from half way between the supply voltages, In the case of a square wave, for which this example of the feedback circuit is principally designed that occurs when the mark space ratio is 50:50.

Therefore it can be seen that the op amp circuit measures and controls the mark space ratio. Other methods of measuring the mark space ratio could be used, The low pass filtering can be used for other kinds of CML input signal if the average level is predictable and the bias provided to the positive input of the op amp circuit can be set accordingly.

Note that the feedback loop provided by the op amps is not essential to the CML to CMOS converter itself. The biases for the amplification stage could be provided, for example, by static bias circuits. With these however operation may be limited to particular ranges of input signals, and the mark space ratio of the output will not be dynamically controlled.

Note also that the self biasing feature (i.e. connection of the outputs 16 to the transistors 15, 15') is not essential to the feedback provided by the op amps; for example the transistors 15, 15' could be replaced by a simple current source or by a connection between the negative supply and the sources of the NMOS transistors 13, 13'.

The CML-CMOS converter of the present invention allows greater speed of conversion because of reduced voltage mismatch: the op amps are now the greatest source of mismatch. The CML-CMOS converter also provides an improvement in the offset.

While the invention has been shown and described with reference to preferred embodiments thereof, it is well understood by those skilled in the art that various changes and modifications can be made in the invention without departing from the spirit and scope of the invention as defined by the appended claims.

The invention claimed is:

1. A CML to CMOS converter comprising:
   two current sources both connected between a first power supply, having a first potential, and a driving node,
   first and second push-pull drive stages each having a current path connected between a second power supply, having a second potential, and the driving node, and each having a control input for one half of a CML signal and an output node,
   wherein each of the two output nodes is connected to the control node of a respective one of the current sources, each current source being connected to decrease the current it supplies to the driving node if the potential of its respective output of the converter moves towards the potential of the first power supply
   wherein each push-pull stage comprises a PMOS transistor having a current path connected between the second power supply and the respective output node and an NMOS transistor connected between the respective output node and the driving node and wherein each push-pull stage comprises a capacitor connected between the respective control input and at least one of the gates of the PMOS and NMOS transistors of the push-pull stage.

2. A converter according to claim 1 wherein the current sources each comprise an NMOS transistor and the control input of the current source is provided by the gate of the NMOS transistor.

3. A converter according to claim 1 wherein each push-pull stage comprises a capacitor connected between the respective control input and the gate of the PMOS transistor of the push-pull stage and wherein each respective control input is directly connected to gate of NMOS transistor of the push-pull stage.

4. A converter according to claim 1 wherein the gate of each PMOS transistor of the push-pull stages is connected to a bias and wherein each respective control input of the push-pull stage is directly connected to gate of NMOS transistor of the push-pull stage.

5. A converter according to claim 1 wherein in each of the push-pull stages the gates of the PMOS and NMOS transistors are connected to the same bias as each other.

6. A converter according to claim 3 wherein in each push-pull stage the gate of the PMOS transistor is connected to a bias.

7. A CML to CMOS converter comprising:
   first and second push-pull drive stages each having a current path connected between a power supply and a driving node and each having a control input for one half of a CML signal and an output node,
   wherein each push-pull drive stage has a bias node connected to receive a bias level that biases the push-pull stage to control the mark space ratio of the output from the output node of the push pull stage, and
   wherein the converter comprises, for each push-pull stage a respective feedback circuit, each feedback circuit being responsive to the mark space ratio of the output from the output node of the push-pull stage to adjust the level of a bias output of the feedback circuit that is connected to the bias input of the push-pull stage.

8. A converter according to claim 7 wherein each feedback circuit comprises: a low pass filter connected to receive and filter the output signal from the respective push-pull stage.

9. A converter according to claim 8 wherein each feedback circuit comprises:

an operational amplifier having a non-inverting input connected to receive a bias level, an inverting input connected to receive the filtered output of the low pass filter and an output connected to provide the bias level to the respective push-pull stage.

10. A converter according to claim 9 wherein each feedback circuit comprises a second low pass filter connected to receive and filter the bias output of the operational amplifier of the feedback circuit before that is applied to the respective push-pull stage.

11. A converter according to claim 7 comprising respective inverting CMOS devices connected between the outputs of the push-pull stages and the respective feedback circuits.

12. A converter according to claim 7 comprising a buffering stage connected between the outputs of the push-pull stages and the respective feedback circuits.

13. A converter according to claim 7 comprising respective inverting CMOS device connected between the outputs of the push-pull stages and the respective feedback circuits, and comprising a buffering stage connected between the inverting CMOS devices and the feedback circuits.

14. A converter according to claim 7 wherein each push-pull stage comprises a PMOS transistor having a current path connected between the power supply and the output node of the push-pull stage and a gate connected to receive the bias output of the feedback circuit.

15. A converter according to claim 14 wherein each push-pull stage has an NMOS transistor connected between the respective output node and the driving node.

16. A converter according to claim 15 wherein each push-pull stage comprises a capacitor connected between the respective control input and the gates of both the PMOS and NMOS transistors of the push-pull stage.

17. A converter according to claim 15 wherein each push-pull stage comprises a capacitor connected between the respective control input and the gate of the PMOS transistor of the push-pull stage and wherein each respective control input is directly connected to the gate of NMOS transistor of the push-pull stage.

18. A converter according to claim 15 wherein the gate of each PMOS transistor of the push-pull stages is connected to the bias, but not to the control input of the push-pull stage, and wherein each respective control input of the push-pull stages is directly connected to gate of NMOS transistor of the push-pull stage.

19. A converter according to claim 7 comprising a current source or sources connected between the driving node and another power supply.

20. A CML to CMOS converter comprising:
first and second push-pull drive stages each having a current path connected between a power supply and a driving node and each having a control input for one half of a CML signal and an output node,
wherein each push-pull drive stage has a bias node connected to receive a bias level that biases the push-pull stage and affects the mark space ratio of the output from the output node of the push pull stage, and
wherein the converter comprises, for each push-pull stage a respective feedback circuit, each feedback circuit being responsive to the mark space ratio of the output from the output node of the push-pull stage to adjust the level of a bias output of the feedback circuit that is connected to the bias input of the push-pull stage, and
wherein each feedback circuit comprises: a low pass filter connected to receive and filter the output signal from the respective push-pull stage.

21. A converter according to claim 20 wherein each feedback circuit comprises:
an operational amplifier having a non-inverting input connected to receive a bias level, an inverting input connected to receive the filtered output of the low pass filter and an output connected to provide the bias level to the respective push-pull stage.

22. A converter according to claim 21 wherein each feedback circuit comprises a second low pass filter connected to receive and filter the bias output of the operational amplifier of the feedback circuit before that is applied to the respective push-pull stage.

* * * * *